United States Patent [19]
Nashimoto et al.

[11] Patent Number: 5,726,494
[45] Date of Patent: Mar. 10, 1998

[54] SEMICONDUCTOR DEVICE HAVING A PLATED HEAT SINK

[75] Inventors: Yasunobu Nashimoto; Hiroaki Tsutsui, both of Tokyo, Japan

[73] Assignee: NEC Corporation, Tokyo, Japan

[21] Appl. No.: 806,727

[22] Filed: Feb. 27, 1997

Related U.S. Application Data

[63] Continuation of Ser. No. 591,977, Jan. 29, 1996.

[30] Foreign Application Priority Data

Jan. 27, 1995 [JP] Japan ........................ 7-031350

[51] Int. Cl.$^6$ .................. H01L 23/34; H01L 23/06; H01L 7/20
[52] U.S. Cl. .................. 257/712; 257/713; 257/717; 257/720; 361/688; 361/707; 361/704; 361/711
[58] Field of Search .................. 257/712, 713, 257/717, 720; 361/688, 697, 704, 707, 705, 708, 711, 712, 714

[56] References Cited

U.S. PATENT DOCUMENTS

| | | | |
|---|---|---|---|
| 5,045,503 | 9/1991 | Kobiki et al. | 257/712 |
| 5,144,413 | 9/1992 | Adlerstein | 257/712 |

FOREIGN PATENT DOCUMENTS

| | | |
|---|---|---|
| 63-198363 | 3/1988 | Japan. |
| 63-220576 | 9/1988 | Japan. |

*Primary Examiner*—Carl W. Whitehead
*Attorney, Agent, or Firm*—Sughrue, Mion, Zinn, Macpeak & Seas

[57] ABSTRACT

A semiconductor device having a plated heat sink structure is provided, in which an Au layer (5) high in thermal expansion coefficient is formed on the lower surface of a GaAs substrate (1) having a source electrode (2), a gate electrode (3) and a drain electrode (4) of a field effect transistor on the upper surface, and, a W layer (6) low in thermal expansion coefficient is formed on the lower surface of the Au layer (5). Warping of the device after mounted on a package is reduced on the ground of such a plated heat sink structure.

18 Claims, 7 Drawing Sheets

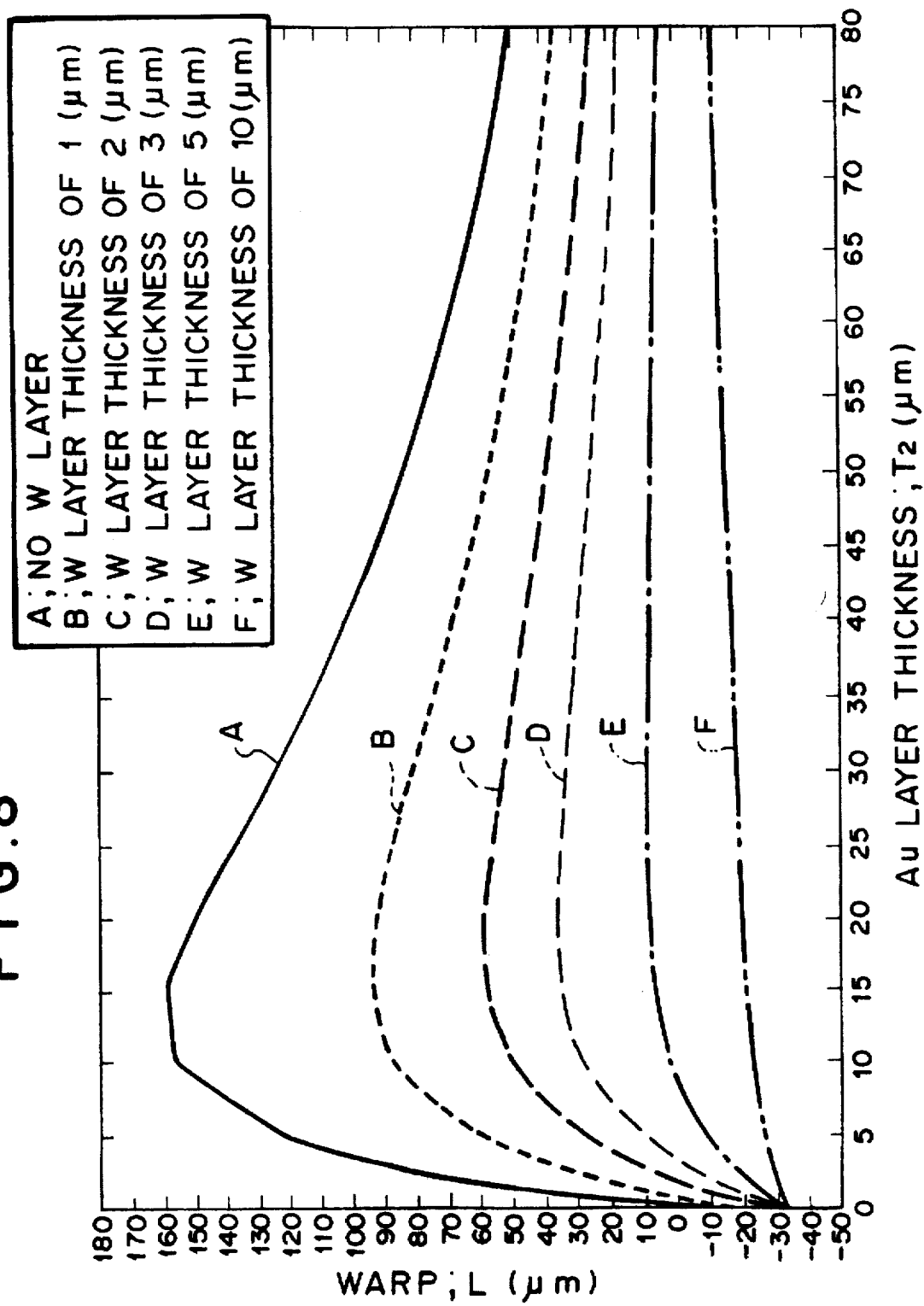

SEMICONDUCTOR DEVICE HAVING A PLATED HEAT SINK

This is a continuation of application Ser. No. 08/591,977 filed Jan. 29, 1996.

FIELD OF THE INVENTION

The present invention relates to a semiconductor device and, in particular to a semiconductor device having a plated heat sink (PHS) structure.

BACKGROUND OF THE INVENTION

A specific example of a conventional semiconductor device having the PHS structure is hereinafter described with reference to FIGS. 1A and 1B.

FIG. 1A is a cross-sectional view of the conventional semiconductor device, in particular showing a semiconductor chip before mounted on a package. Referring to FIG. 1A, circuit elements such as transistors or the like are formed on the upper surface of a GaAs substrate 1, which is the semiconductor substrate. As a circuit element of the semiconductor device of FIG. 1A, a field effect transistor (FET) is employed and, a source electrode 2, a gate electrode 3 and a drain electrode 4 are formed on the upper surface of the substrate 1.

In a high output semiconductor device in which a compound semiconductor substrate such as GaAs substrate or the like is used, which is great in thermal resistance, since generation of heat at the circuit element is considerable, the substrate is made thin and, on its rear or lower surface, a metal layer, for example, an Au layer 5, which is small in heat resistance, is provided to form the plated heat sink.

FIG. 1B is a cross-sectional view of the semiconductor device of FIG. 1A, in particular showing the semiconductor chip after mounted on a Cu package 8, which is excellent in thermal conductivity, by using AuSn solder 7, a low melting point metal solder.

In the foregoing conventional semiconductor device, since a double-layered structure comprising the semiconductor substrate 1 and the PHS metal layer 5 is adopted, the chip warps due to a bimetal effect as shown in FIG. 2 when temperature is raised up to the melting point of the solder 7 during a process for mounting the chip on the package 5. Further, as will be described later, it is necessary to lower the thermal resistance of the chip in order to make the output of the GaAs field effect transistor high. However, if the GaAs substrate is made thin for lowering the thermal resistance, then the warping is further increased due to the bimetal effect promoted by the presence of the plated heat sink. Furthermore, if the metal layer of the plated heat sink is made thin, then mechanical strength of the device is decreased.

In order to reduce the warping, in, for example, Japanese Patent Application Laid-Open No. 63-198363, as shown in FIG. 3, there is proposed a structure in which a recess portion looking like a bathtub is formed on the lower surface of the semiconductor substrate (GaAs substrate) 1 and in which a heat radiating metal (Au) 5 is filled with this recess portion. However, in this case, it is necessary to leave a downwardly protruding portion of the semiconductor substrate at the periphery thereof, and the entire lower surface of the chip cannot be polished at the same time. Instead, it is necessary to form the recess portion by partial etching, which, however, can cause some problems in view of the increased number of processes and the reduced working accuracy. Further, there is a problem that, depending on the difference of thermal expansion between the Au layer 9 and the GaAs substrate 1, cracks occur in the GaAs substrate 1.

Further, in, for example, Japanese Patent Application Laid-Open No. 63-220576, as shown in FIG. 4, there is proposed a structure in which the thermal expansion coefficient of the thick electrode/conductor portion of the circuit element on the upper surface of the semiconductor substrate is set as high as that of the plated heat sink metal layer 5 so as to reduce warping. However, in this case, since the thickness of the electrode/conductor portion on the upper surface need to be set as high as that of the plated heat sink metal layer, a patterning technique of the thick metal layer becomes necessary. Further, there is a problem that warping cannot be sufficiently suppressed due to small area of the patterned surface electrode/conductor portion.

SUMMARY OF THE INVENTION

In view of the foregoing, an object of the present invention is to eliminate the problems inherent to the foregoing conventional technique and to provide a structure allowing the warping of the chip after mounted on the package to be reduced for the semiconductor device having the plated heat sink (PHS) structure.

In order to achieve the foregoing object, according to the present invention, there is provided a semiconductor device having a plated heat sink (PHS) structure adapted for releasing heat evolved by a semiconductor substrate through a metal layer formed on one surface of the semiconductor substrate, the plated heat sink structure comprising two or more layers of a first kind of metal layer and a second kind of metal layer alternately disposed, the first kind of metal layer differing in thermal expansion coefficient from the second kind of metal layer.

In one aspect of the present invention, the first kind of metal layer has a thermal expansion coefficient higher than that of the semiconductor substrate, a metal layer formed immediately on the one surface of the semiconductor substrate is the first kind of metal layer, and the second kind of metal layer has a thermal expansion coefficient lower than that of the first kind of metal layer. For example, the second kind of metal layer having the thermal expansion coefficient of above ⅕ and below ½ of that of the first kind of metal layer is used.

In another aspect of the present invention, two or more pairs of the first kind of metal layer and the second kind of metal layer are provided.

In the other aspect of the present invention, the semiconductor substrate is a GaAs substrate, the first kind of metal layer is an Au layer, and the second kind of metal layer is a W layer or a Mo layer.

In the other aspect of the present invention, a circuit element is formed on another surface of the semiconductor substrate.

In the other aspect of the present invention, the semiconductor substrate is mounted on a package with the plated heat sink structure interposed therebetween.

In order to achieve the foregoing object, according to the present invention, there is also provided a semiconductor device having a plated heat sink (PHS) structure adapted for releasing heat evolved by a semiconductor substrate through a metal layer formed on one surface of the semiconductor substrate, the metal layer of the plated heat sink structure being thinner than the semiconductor substrate, a solder layer being formed on a surface of the metal layer.

In an aspect of the present invention, a thickness of the metal layer is set to below ⅕ of that of the semiconductor substrate.

In an aspect of the present invention, a thickness of the solder layer is set to above ⅕ and below 3 of that of the semiconductor substrate.

In an aspect of the present invention, the semiconductor substrate is a GaAs substrate, the metal layer is an Au layer, and the solder layer is an AuSn layer.

According to the present invention, when the chip of the semiconductor device which comprises a laminated structure of the semiconductor substrate and the PHS metal layer is mounted onto the package to raise the temperature up to the melting point of the solder, warping of the chip which is caused by the bimetal effect can be reduced to a great extent. That is, according to the Present invention, since the second kind of metal layer of the PHS structure which is small in thermal expansion is formed on the first kind of metal layer (Au layer) of the PHS structure, a force trying to warp in the direction opposite to that of the warp as occurs when the chip without the second kind of the metal layer is mounted reacts with the result that the warp of the chip is suppressed as a whole. As to the quantitative effect of the present invention, warp of the chip after mounted can be reduced to the order of ⅕ of the conventional device.

Further, according to the present invention, when two kinds of metal layers which differ in thermal expansion coefficient are laminated alternately with a plurality of each kind of metal, a plurality of interfaces between them exists, and the stress in the direction parallel to the interfaces which is caused by the difference of thermal expansion is dispersed, and the danger of peeling-off of the layers can be avoided without inserting a certain bonding layer.

Further, according to the present invention, since the solder layer (AuSn layer) is formed sufficiently thick on the surface of the PHS metal layer (Au layer) having the thickness smaller than that of the semiconductor substrate, mechanical strength of the chip before mounted on the package can be assured, and breakage of the chip during handling when assembled is avoided. Also, since, when the chip is mounted, it is heated to above the melting point of AuSn and the AuSn layer formed on the rear surface of the chip melts, which plays the role of solder adapted for mounting, it does not lend itself to the warping of the chip, but the warping of the chip after mounted depends only on the bimetal effect caused by the semiconductor substrate and the metal layer (Au layer) which is small in thickness, so that, when the Au layer is made thin, the warping of the chip, which is caused by the bimetal effect, can be made very small. According to the present invention, the assembly process can be simplified through elimination of the need to supply the solder when the chip is mounted.

BRIEF DESCRIPTION OF THE DRAWINGS

FIG. 8 is a graph showing a relationship between the thickness of the plated heat sink metal layer and the warp of the chip.

DESCRIPTION OF THE PREFERRED EMBODIMENTS

Several embodiments of the present invention are hereinafter described with reference to the accompanying drawings.

Figure 5A:
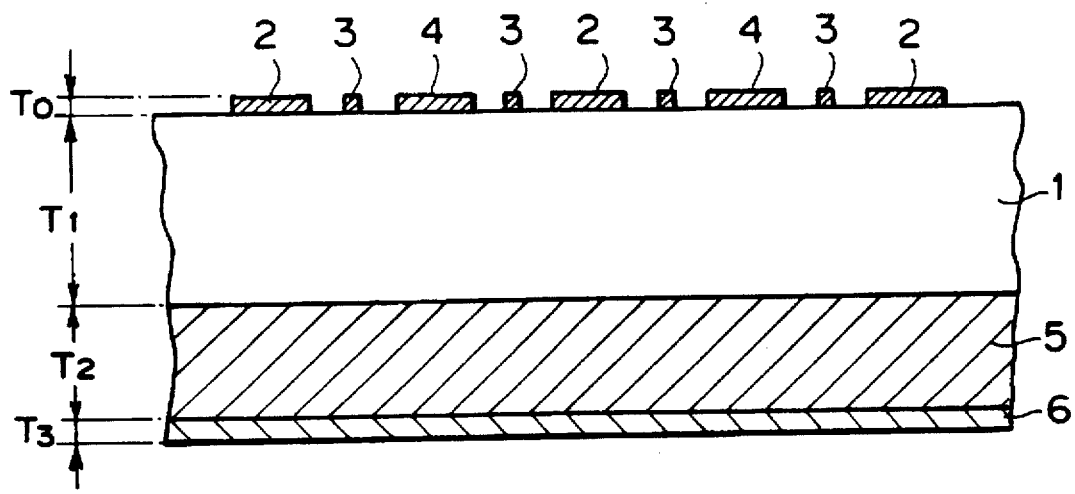
FIG. 5A is a cross-sectional view for explaining a first embodiment of the present invention, illustrating the structure of a chip before mounted on the package.

FIG. 5A is a cross-sectional view of a semiconductor chip of a semiconductor device according to a first embodiment of the present invention before mounted on a package.

Referring to FIG. 5A, a source electrode 2, a gate electrode 3 and a drain electrode 4 of a high output field effect transistor are each formed on the upper surface of a GaAs substrate 1 having a thermal expansion coefficient of $5.9 \times 10^{-6}$ [$K^{-1}$], and an Au layer 5 having a thermal expansion coefficient of $14.1 \times 10^{-6}$ [$K^{-1}$] deposited according to a plating process or the like and a W (tungsten) layer 6 having a thermal expansion coefficient of $4.9 \times 10^{-6}$ [$K^{-1}$] deposited according to a sputtering process or the like are formed in this order on the rear or lower surface of the GaAs substrate 1. The thickness $T_o$ of the electrodes 2, 3, 4 was set to about 2[μm].

Figure 5B:
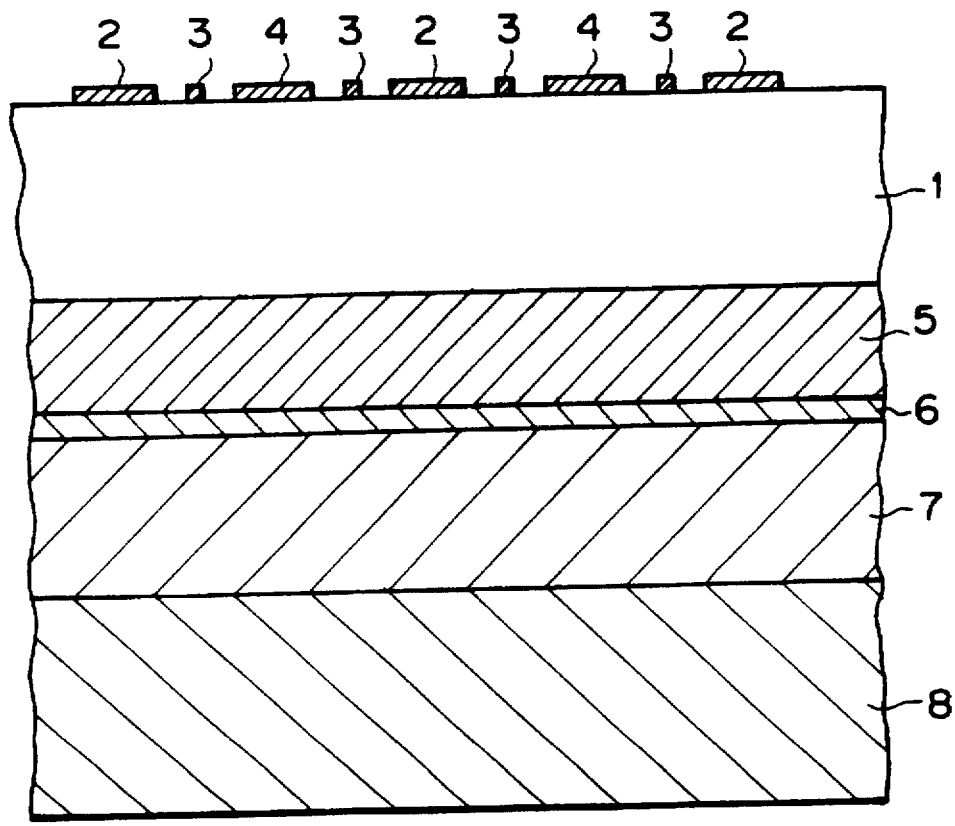
FIG. 5B is a cross-sectional view for explaining the first embodiment of the present invention, illustrating the structure of the chip after mounted on the package.

FIG. 5B is a cross-sectional view of the semiconductor chip shown in FIG. 5A after mounted on a Cu package 8 excellent in the thermal conductivity by using a low melting point AuSn solder 7.

The heat evolved from the high output field effect transistor is transmitted through the GaAs substrate 1 and is emitted toward the Cu package 8 through the Au layer 5 and the W layer 6.

Here, the thermal conductivity of the GaAs substrate 1 is on the order of 45 [$Wm^{-1}K^{-1}$], which is twice or triple as great as that of the Si substrate. Therefore, in order to make the thermal resistance of the GaAs substrate 1 as small as possible, it is necessary to make the thickness $T_1$ of the GaAs substrate 1 as small as possible, for example, preferably 50[μm] or less. The thickness $T_1$ is preferably 10[μm] or more in view of the working accuracy in etching or polishing process. In this embodiment, the thickness $T_1$ of the GaAs substrate 1 was set to 25[μm].

Further, if the GaAs substrate 1 is made thinner, then the mechanical strength is reduced. In order to prevent the reduction of the mechanical strength, it is preferable to set the thickness $T_2$ of the Au layer 5 which is used for the plated heat sink formed on the rear surface of the semiconductor substrate 1 to 0.1[μm] or more. The thickness $T_2$ is preferably 50[μm] or less in view of the economy. In this embodiment, the thickness $T_2$ of the Au layer 5 was set to 15[μm].

Figure 2:
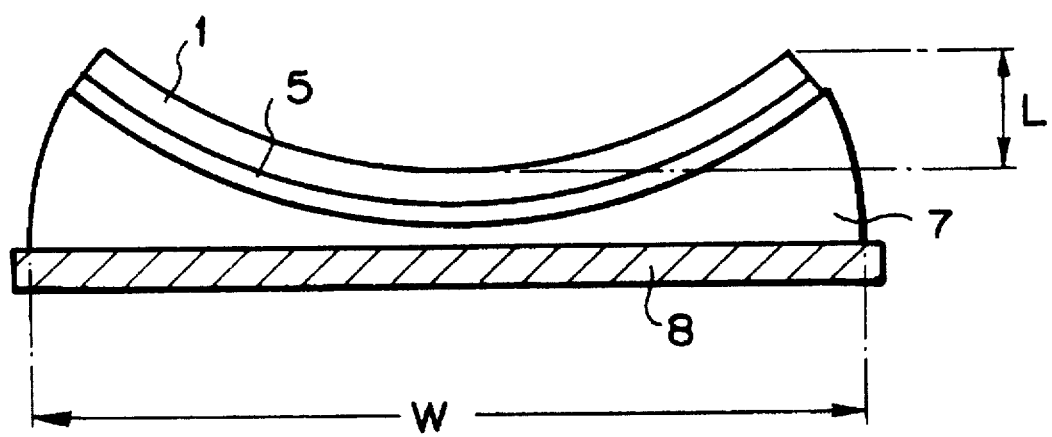
FIG. 2 is a view for explaining warp of the chip which occurs after a conventional semiconductor chip is mounted on the package.
Figure 3:
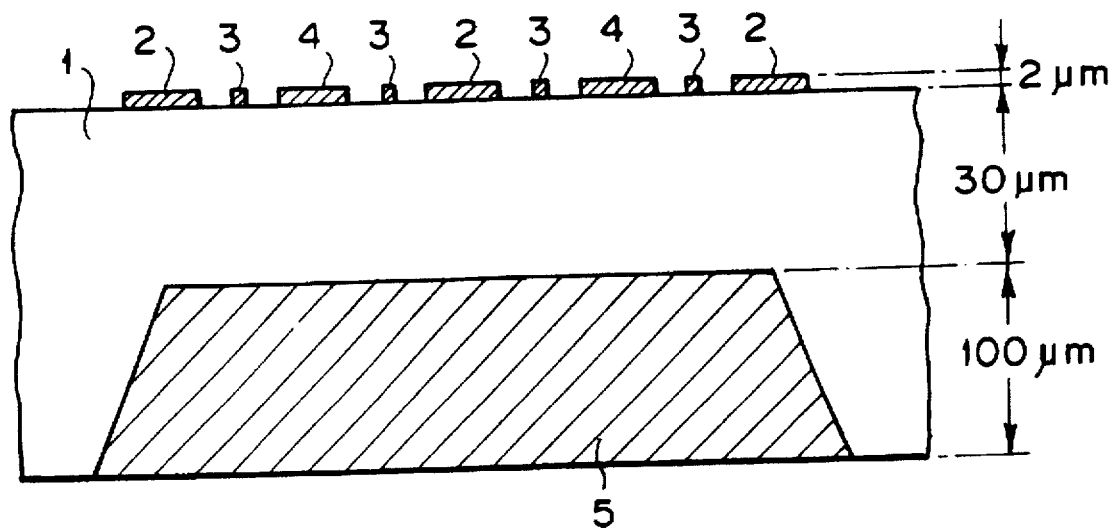
FIG. 3 is a cross-sectional view for explaining a conventional semiconductor device.
Figure 4:
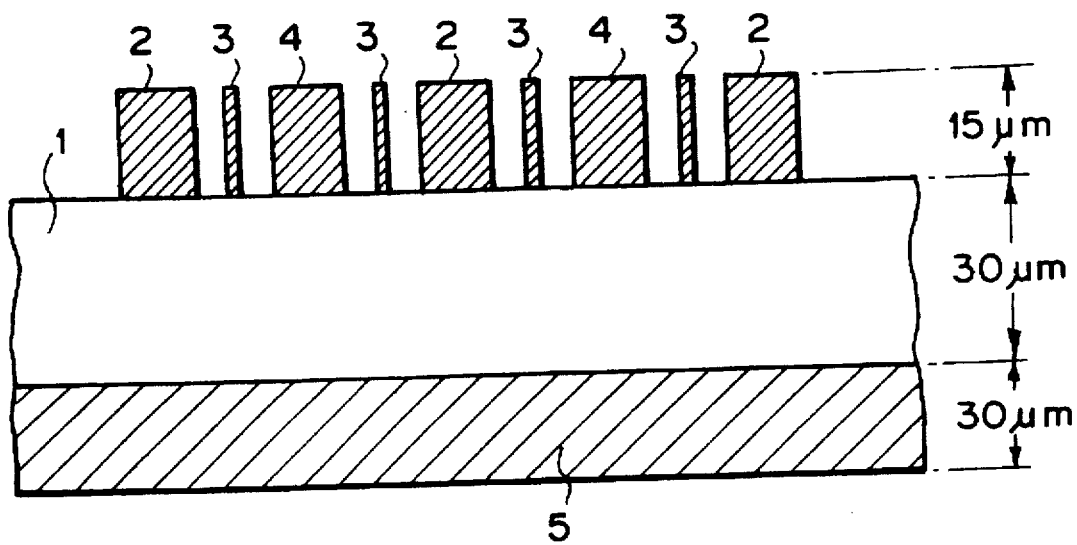
FIG. 4 is a cross-sectional view for explaining a conventional semiconductor device.

In the semiconductor device having a width W of 4 [mm], if such a W layer 6 is not provided, when the chip is mounted on the package 8 by means of AuSn solder 7, it is heated to above 280 degrees Centigrade, the melting point of AuSn (Sn: 20 wt %) and, at that time, warp L (see FIG. 2) of the chip which is caused on the basis of the difference of the thermal expansion coefficient between the GaAs substrate 1 and the Au layer 5 will become above 100[μm].

FIG. 8 is a graph illustrating the result of calculated warp L of the chip as mounted, which was calculated from the thermal expansion with the thickness of the Au layer 5 and the thickness of the W layer 6 when the width W is 4 [mm]. In FIG. 8, the vertical axis plots the warp L shown in FIG. 2, and a curve A plots the warp L of the chip which has no W layer 5 on the Au layer 5 and curves B, C, D, E and F each plot the warp L in the case where the thickness of the W layer 6 is 1, 2, 3, 5 and 10 respectively.

As shown by the curve A of FIG. 8, if there is no W layer, when the thickness of the Au layer 5 is on the order of 15 [μm] for the thickness 25 [μm] of the GaAs substrate 1, the warp L becomes greatest (the maximum value 160[μm]).

However, if the W layer 6, small in thermal expansion coefficient, is formed on the lower surface of the Au layer 5, a force which tries to warp the chip in the opposite direction works and the warping of the chip is suppressed as a whole.

According to the calculation from the thermal expansion, as shown by the curves B to F of FIG. 8, the degree of suppression of the warp L depends on the thickness of the W layer 6.

As shown in FIG. 8, in this embodiment, if the W layer 6 is formed on the Au layer 5 to the thickness of 3 [μm], warp L of the chip can be suppressed to about 1/5 as compared with the case where there is no W layer.

The thickness $T_3$ is preferably within the range of 2.5 to 12 [μm], more preferably 3 to 10[μm] in view of suppressing the warp in both directions.

Incidentally, although, in this embodiment, the W layer 6 was used, instead, other metals small in thermal expansion coefficient such as Mo or the like may be used.

Figure 6A:
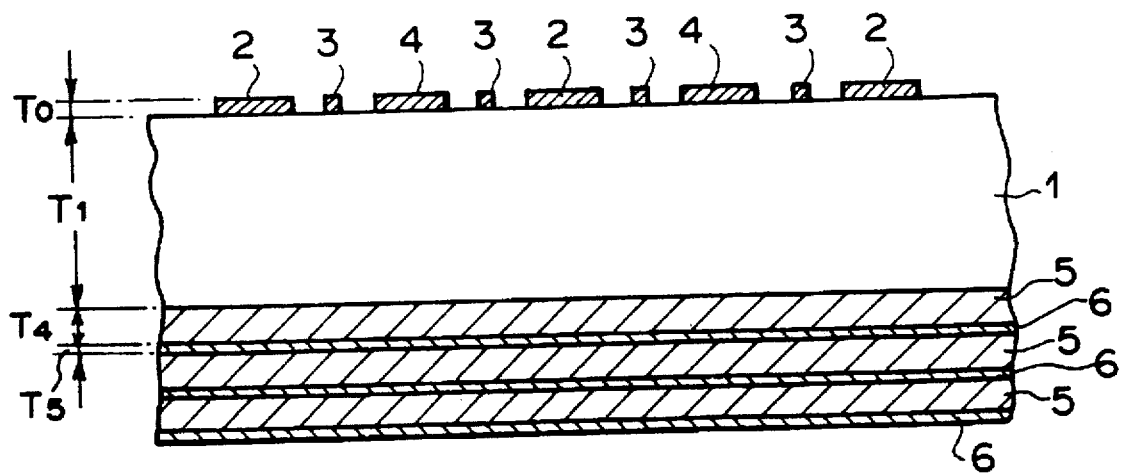
FIG. 6A is a cross-sectional view for explaining a second embodiment of the present invention, illustrating the structure of a chip before mounted on the package.
Figure 6B:
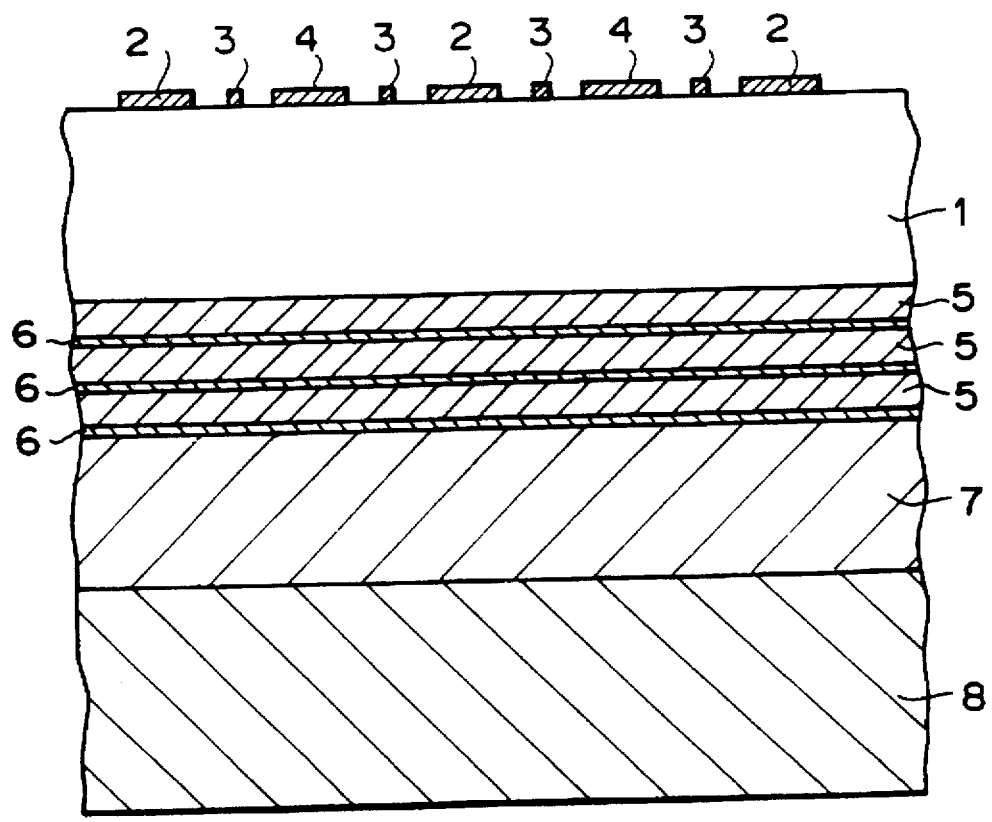
FIG. 6B is a cross-sectional view for explaining the second embodiment of the present invention, illustrating the structure of the chip after mounted on the package.

FIG. 6A is a cross-sectional view of a semiconductor chip of a semiconductor device according to a second embodiment of the present invention before mounted on the package, and FIG. 6B is a cross-sectional view of the semiconductor chip shown in FIG. 6A after mounted on the Cu package 8 excellent in the thermal conductivity by using a low melting point AuSn solder 7.

Referring to FIG. 6A, in this embodiment, as in the foregoing first embodiment, a source electrode 2, a gate electrode 3 and a drain electrode 4 of a high output field effect transistor are each formed on the upper surface of a GaAs substrate 1. On the rear or lower surface of the GaAs substrate 1, an Au layer 5 deposited according to the plating process or the like and a W layer 6 deposited according to the sputtering process or the like are formed.

In this embodiment, the thickness of the GaAs substrate 1 was set to 25[μm]. In this embodiment, the thickness $T_4$ of the Au layer 5 was set to 5 [μm], and the thickness $T_5$ of the W layer 6 was set to 1 [μm], and as shown in FIG. 6A, three of them were alternately disposed. In this embodiment, CVD process was used to form the W layer 6.

The thickness $T_4$ is preferably within the range of 0.1 to 20 [μm]. The thickness $T_5$ is preferably within the range of 0.1 to 3 [μm].

Also in this embodiment, as compared with the semiconductor device having the width W of 4 [mm] and lacking the W layer 6, warp L of the chip after mounted could be suppressed to below 1/5.

In the foregoing first embodiment, there is only one interface of the Au layer 5 and the W layer 6 and therefore, stress in the direction parallel to the interface which is caused by the difference in thermal expansion coefficient between the layers 9, 6 is concentrated, and sometimes the bonding strength at the interface becomes problematic. If peeling of the layers due to such a stress is problematic, then a thin bonding layer made of, for example, Ti need to be inserted between the Au layer 9 and the W layer 6.

However, according to this second embodiment, there exists a plurality of interfaces between the Au layer 5 and the W layer 6, and the stress in the direction parallel to the interface, which is caused by the difference of the thermal expansion, is dispersed into the plurality of interfaces, and the danger of peeling of the layers is eliminated without inserting the bonding layer.

Incidentally, although, in this embodiment, the W layer 6 was used, other metals small in thermal expansion coefficient such as Mo having a thermal expansion coefficient of $5.1 \times 10^{-6}$ [$K^{-1}$] or the like may be used.

Figure 7A:
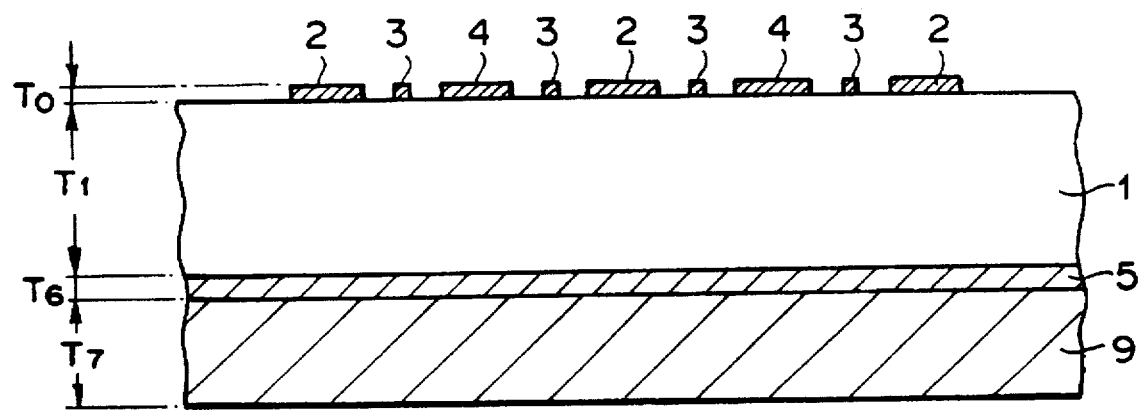
FIG. 7A is a cross-sectional view for explaining a third embodiment of the present invention, illustrating the structure of a chip before mounted on the package.
Figure 7B:
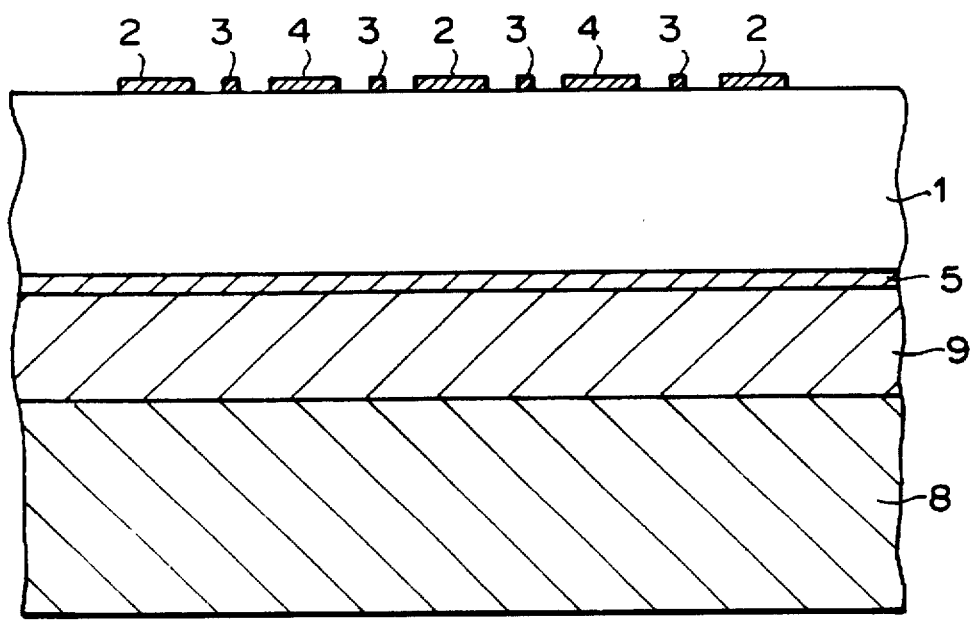
FIG. 7B is a cross-sectional view for explaining the third embodiment of the present invention, illustrating the structure of the chip after mounted on the package.

FIG. 7A is a cross-sectional view of a semiconductor chip of a semiconductor device according to a third embodiment of the present invention before mounted on the package, and FIG. 7B is a cross-sectional view of the semiconductor chip shown in FIG. 7A after mounted on the Cu package 8 excellent in the thermal conductivity.

Referring to FIG. 7A, in this embodiment, as in the foregoing first and second embodiments, a source electrode 2, a gate electrode 3 and a drain electrode 4 of a high output field effect transistor are each formed on the upper surface of a GaAs substrate 1. On the rear or lower-surface of the GaAs substrate 1, an Au layer 5 and an AuSn layer (Sn: 20 wt %) 9 are formed according to the plating process or the like.

In this embodiment, the thickness $T_1$ of the GaAs substrate 1 was set to 25[μm]. In this embodiment, the thickness $T_6$ of the Au layer 5 was set to 2[μm], and the thickness $T_7$ of the AuSn layer 9 was set to 15[μm].

Assuming that there is no AuSn layer 9, as shown by the curve A of FIG. 8, if the Au layer 5 is made thin down to 2[μm], warp of the chip due to the bimetal effect is very small. However, in this case, the chip is small in mechanical strength, which can bring about damage of the chip when handled in assembling process with high probability.

However, in this third embodiment, since the AuSn layer 9 is formed sufficiently thick on the surface of the Au layer 5, the mechanical strength is further increased and, even when handled in assembling process, the chip can be broken with very low probability.

When the chip is mounted, it is heated to above the melting point 280 degrees Centigrade of AuSn, so that the AuSn layer 9 formed on the rear surface of the chip is melted, which serves as the solder adapted for mounting of the chip. Since AuSn melts, it does not lend itself to warping of the chip and, warping of the chip after mounting depends only on the bimetal effect resulting from the GaAs substrate 1 and the Au layer 5. As a result, in this embodiment, thanks to the thin Au layer 5, warp of the chip can be made very small.

Figure 1A:
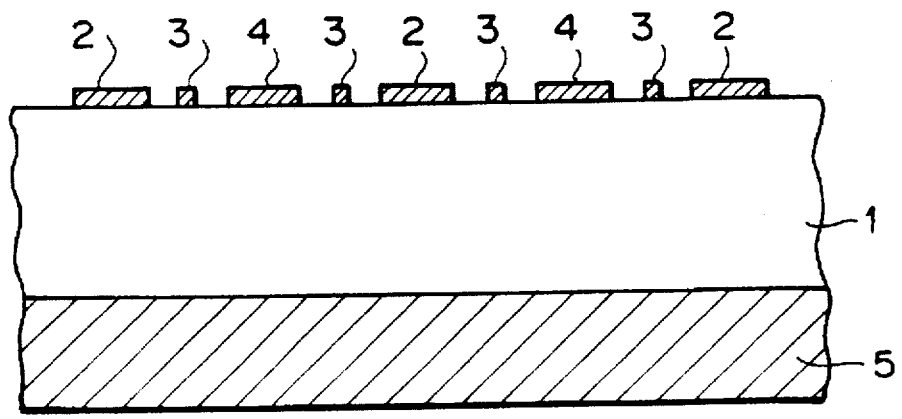
FIG. 1A is a cross-sectional view illustrating the structure of a chip of a conventional semiconductor device before mounted on a package.
Figure 1B:
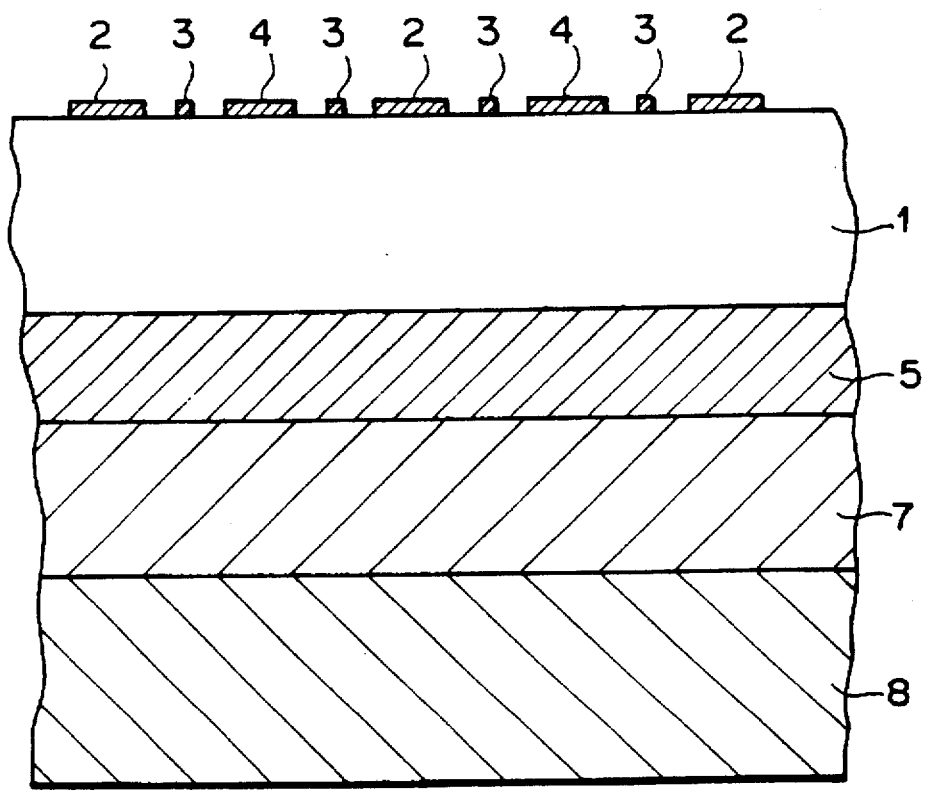
FIG. 1B is a cross-sectional view illustrating the structure of the chip of FIG. 1A after mounted on the package.

Warp of the chip is caused by the bimetal effect on the basis of the difference in the thermal expansion coefficient between the GaAs substrate 1 and the Au layer 5, and the magnitude of the warp depends on the ratio between the thickness of the GaAs substrate 1 and the Au layer 5. In the conventional embodiment of FIGS. 1A, 1B if the Au layer 5 is made thin, the mechanical strength is reduced and therefore, the Au layer 5 had to be made thick in order to maintain the sufficient mechanical strength, which has brought about a great warp due to the bimetal effect (When the thickness of the GaAs substrate 1 is 25 [μm], the warp becomes greatest at the Au layer thickness of 15[μm]). On the other hand, in this third embodiment, since the Au layer thickness can be made thinner (e.g. thickness of 2 [μm]) by securing a sufficient mechanical strength with the thick AuSn layer (e.g. thickness of 15[μm]) before mounting on the package 8, warp due to the bimetal effect can be made small. That is, in this embodiment, since the Au layer 5 can be made thin as compared with the conventional device of FIGS. 1A, 1B, warp of the chip can be made very small.

Thus, in this embodiment, when the width W of the device is 4 [mm] and the Au layer thickness $T_6$ is 2[μm], as compared with the conventional semiconductor device having the width W of 4 [mm] and the Au layer thickness is 15 [μm], warp of the chip after mounted could be suppressed to below ⅓.

The thickness $T_6$ is preferably 0.1[μm] or more in view of the mechanical strength, and preferably 3[μm] or less in view of suppressing the warp.

The thickness $T_7$ is preferably 10 [μm] or more in view of the mechanical strength, and preferably 50 [μm] or less in view of the economy.

Although, in this embodiment, the AuSn layer 9 was formed with an alloy, the Au layer and the Sn layer may be formed into a laminated structure to such a thickness as, when heated, they form an eutectoid alloy.

Although the present invention was described with reference to the foregoing embodiments, it is not restricted to them only, but includes other various embodiments conforming to the principle of the present invention.

What is claimed is:

1. A semiconductor device having a plated heat sink structure for releasing heat evolved by the device, comprising:
    a semiconductor substrate having an upper surface for forming circuit elements and a lower surface;
    a first metal layer formed on said lower surface of said semiconductor substrate and made of a first kind of metal; and
    a second metal layer formed on said first metal layer and made of a second kind of metal;
    wherein said second metal layer has a thermal expansion coefficient less than ½ the thermal expansion coefficient of said first metal layer to reduce chip warping of said semiconductor substrate when said semiconductor device is solder mounted to a package.

2. A semiconductor device as set forth in claim 1, wherein said first metal layer has a thermal expansion coefficient higher than that of the semiconductor substrate and said second metal layer has a thermal expansion coefficient lower than that of the first metal layer.

3. A semiconductor device as set forth in claim 1, wherein two or more pairs of said first metal layer and said second metal layer are alternately disposed on one another on the lower surface of said semiconductor substrate.

4. A semiconductor device as set forth in claim 1, wherein said semiconductor substrate is a GaAs substrate.

5. A semiconductor device as set forth in claim 1, wherein said first metal layer is an Au layer.

6. A semiconductor device as set forth in claim 1, wherein said second metal layer is a W layer or a Mo layer.

7. A semiconductor device as set forth in claim 1, wherein a circuit element is formed on said upper surface of said semiconductor substrate.

8. A semiconductor device as set forth in claim 1, wherein said semiconductor substrate is mounted on a package with said plated heat sink structure interposed therebetween.

9. A semiconductor device as set forth in claim 1, wherein said semiconductor substrate is a gallium arsenide substrate, said first metal layer is a gold layer, and said second metal layer is a tungsten layer.

10. A semiconductor device as set forth in claim 1, wherein said semiconductor substrate is a gallium arsenide substrate, said first metal layer is a gold layer, and said second metal layer is a molybdenum layer.

11. A semiconductor device as set forth in claim 9, wherein said semiconductor device is mounted to a copper package.

12. A semiconductor device as set forth in claim 9, wherein said semiconductor substrate has a thickness of less than 50 μm, said first metal layer has a thickness between 0.1 μm and 50 μm, and said second metal layer has a thickness between 2.5 μm and 12 μm.

13. A semiconductor device as set forth in claim 2, wherein said thermal expansion coefficient of said second metal layer is in the range of greater than ⅕ and less than ½ said thermal expansion coefficient of said first metal layer.

14. A semiconductor device as set forth in claim 3, wherein said semiconductor substrate is a gallium arsenide substrate, said first metal layer is a gold layer, and said second metal layer is a tungsten layer.

15. A semiconductor device having a plated heat sink structure for releasing heat evolved by the device, comprising:
    a semiconductor substrate having an upper surface for forming circuit elements and a lower surface;
    a first metal layer formed on said lower surface of said semiconductor substrate; and
    a means for reducing chip warping when said semiconductor device is mounted to a package, said means for reducing chip warping having a coefficient of expansion less than that of said first metal layer.

16. A plated heat sink device for releasing heat evolved by a semiconductor substrate, comprising:
    a semiconductor substrate having an upper surface for forming circuit elements and a lower surface;
    a first metal layer formed on said lower surface of said semiconductor substrate and made of a first kind of metal; and
    a second metal layer formed on said first metal layer and made of a second kind of metal, said first and second metal layers being alternately disposed;
    wherein said first metal layer has a different thermal expansion coefficient than said second metal layer and said second metal layer has a lower coefficient of expansion than said first metal layer so as to reduce chip warping of said semiconductor substrate when said plated heat sink formed on said semiconductor substrate is solder mounted to a package.

17. A plated heat sink device as set forth in claim 16, wherein said first metal layer is a gold layer and said second metal layer is a tungsten layer.

18. A plated heat sink device as set forth in claim 16, wherein said first metal layer is a gold layer and said second metal layer is a molybdenum layer.

* * * * *